(12) United States Patent
Parrish

(10) Patent No.: US 7,701,232 B2
(45) Date of Patent: Apr. 20, 2010

(54) ROTATIONAL POSITIONER AND METHODS FOR SEMICONDUCTOR WAFER TEST SYSTEMS

(75) Inventor: Frank Parrish, Simi Valley, CA (US)

(73) Assignee: Teradyne, Inc., North Reading, MA (US)

( * ) Notice: Subject to any disclaimer, the term of this patent is extended or adjusted under 35 U.S.C. 154(b) by 104 days.

(21) Appl. No.: 11/656,825

(22) Filed: Jan. 23, 2007

(65) Prior Publication Data

US 2008/0174330 A1    Jul. 24, 2008

(51) Int. Cl.
*G01R 31/02* (2006.01)
(52) U.S. Cl. .................................................. 324/754
(58) Field of Classification Search ................ 324/754, 324/761, 762, 765, 158.1; 257/48; 438/14–18
See application file for complete search history.

(56) References Cited

U.S. PATENT DOCUMENTS

| | | | |
|---|---|---|---|
| 5,194,743 A | | 3/1993 | Aoyama et al. |
| 5,479,108 A | * | 12/1995 | Cheng .................... 324/765 |
| 5,736,850 A | | 4/1998 | Legal |
| 5,982,132 A | | 11/1999 | Colby |
| 6,011,405 A | * | 1/2000 | Sikora .................... 324/765 |
| 6,204,678 B1 | | 3/2001 | Akram et al. |
| 6,310,486 B1 | | 10/2001 | Trevisan et al. |
| 6,727,723 B2 | * | 4/2004 | Shimizu et al. ............. 324/765 |
| 6,734,688 B1 | | 5/2004 | Castellano et al. |
| 6,756,801 B2 | | 6/2004 | Colby |
| 2005/0006726 A1 | | 1/2005 | Ossimitz |
| 2005/0278134 A1 | | 12/2005 | Langer et al. |
| 2006/0082358 A1 | | 4/2006 | Conner |

OTHER PUBLICATIONS

PCT Search Report dated Jun. 10, 2008 for PCT Application No. PCT/US2008/000708.

* cited by examiner

*Primary Examiner*—Ha Tran T Nguyen
*Assistant Examiner*—Tung X Nguyen
(74) *Attorney, Agent, or Firm*—Foley & Lardner LLP

(57) ABSTRACT

A semiconductor wafer prober is configured to rotate a semiconductor wafer into relative alignment with a wafer-interface probe adapted to simultaneously probe a number of integrated circuits within a sector of the semiconductor wafer. The wafer can include integrated circuits having different orientations, such that all of the integrated circuits within a given sector being tested have the same orientation. For example, a semiconductor wafer can include two semicircular sectors, with the integrated circuits on either sector having a common orientation rotated 180 degrees from a common orientation of the integrated circuits of the other sector. A wafer-interface probe, or probe card, adapted to test the entire semicircular sector during a single touch down is able to test the entire wafer with one rotational translation between testing.

9 Claims, 8 Drawing Sheets

ROTATIONAL POSITIONER AND METHODS FOR SEMICONDUCTOR WAFER TEST SYSTEMS

FIELD OF THE INVENTION

The present invention relates generally to the field of test and measurement equipment and more specifically to functional testing of semiconductor wafers.

BACKGROUND

Manufacturers of semiconductor devices routinely test their products at the wafer level and the packaged-device level using sophisticated test systems commonly referred to as automatic test equipment. The equipment generally drives waveforms to and detects outputs from one or more integrated circuits of a wafer under test. Detected outputs are compared against known good values or ranges to determine whether the integrated circuit is functioning properly. It is beneficial to identify defective integrated circuits on a given wafer before any further effort is made in packaging defective integrated circuits.

A focus of semiconductor manufacturers is improving test throughput to process the highest possible volume of integrated circuits in a most economical manner using automated test systems. Efficient testing of semiconductor devices generally requires an apparatus to move and quickly connect the integrated circuit to the tester. A machine specially adapted to move wafers is referred to as a prober, or more generally as handling apparatus.

One approach to improving throughput at wafer-level test involves testing multiple integrated circuits of a single wafer at substantially the same time. Wafer-interface probes have been developed together with test systems to probe and test multiple integrated circuits during a single touch down of the probe onto the wafer. Despite this approach, multiple touchdowns are still typically required to test all of the integrated circuits of a single wafer. Inefficiencies are introduced when simultaneously probing multiple integrated circuits due at least in part to the circular shape of the wafer substrate; the rectangular arrangement, or lattice, of integrated circuits provided thereon; and the square or rectangular shape of the probing head. Namely, some of the probes do not land on integrated circuits during touch downs performed along the edge portions of the wafer. Consequently, some of the channels available on the test system are left unused. Unused test resources represents an inefficiency resulting in more touchdowns being necessary to test all of the integrated circuits of a single wafer.

Alternatively or in addition, some of the probes may touchdown on the same integrated circuit more than once as a wafer-interface probe is positioned and repositioned to test all of the integrated circuits of a single wafer. Again this results in an inefficient use of test resources.

SUMMARY OF THE INVENTION

What is needed is a wafer-interface probe, a wafer positioning system, and method for minimizing unused probes and multiple touchdowns during the course of testing the integrated circuits of a semiconductor wafer.

Various embodiments of the present invention provide a novel array of contacts for contacting substantially all of the integrated circuits within a common sector of a semiconductor wafer with minimal unused contacts combined with a wafer rotation between test cycles, with each test cycle testing a different sector of the semiconductor wafer. The sector footprint combined with the rotational repositioning is well suited to the circular geometry of the semiconductor wafer.

In one aspect, the invention relates to a semiconductor tester adapted for testing a semiconductor wafer including multiple integrated circuits arranged in a lattice or tiling pattern on a flat surface of the wafer. The semiconductor tester includes a wafer-interface probe having multiple contact patterns, each contact pattern adapted to interface with a corresponding bonding pad pattern of a respective one of the multiple integrated circuits disposed in a lattice on the semiconductor wafer. The semiconductor tester also includes a rotary wafer handler rotating the semiconductor wafer between tests, bringing each of the multiple contact patterns into simultaneous alignment with a bonding pad pattern of a respective one of a multiple integrated circuits. When so aligned, each of the multiple contact patterns provides electrical interconnection with a respective one of the aligned bonding pad patterns.

In another aspect, the invention relates to a process for testing integrated circuits of a semiconductor wafer. Generally, each integrated circuit has a respective bonding pad pattern providing electrical access to the integrated circuit. The test process includes positioning a wafer holding platform having a wafer mounted thereon to initially align the bonding pad patterns of multiple integrated circuits with a respective multiplicity of contact patterns of a wafer-interface probe. The multiple bonding pad patterns are urged into contact with the multiple aligned contact patterns during test. The semiconductor wafer is then rotated by a predetermined angle between tests to align the bonding pad patterns of a different number of integrated circuit with the respective number of contact patterns of the wafer-interface probe.

In another aspect, the invention relates to a semiconductor wafer including a first number of integrated circuits. Each integrated circuit of the first number of integrated circuits has a respective bonding pad pattern with a first common rotational orientation. The wafer also includes a second number of integrated circuits. Each integrated circuit of the second number of integrated circuits has a respective bonding pad pattern with a second common rotational orientation, different from the first.

In yet another aspect, the invention relates to a wafer-interface probe including a number of contact patterns arranged in a non-rectangular, two-dimensional array. Each contact pattern is adapted to interface with a corresponding bonding pad pattern of a respective one of a number of integrated circuits of a semiconductor wafer.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 4A through 4D are plan views of the wafer-interface probe of FIG. 4A positioned to test different respective portions of the semiconductor wafer.

DETAILED DESCRIPTION OF THE PREFERRED EMBODIMENTS

A description of preferred embodiments of the invention follows.

High-volume wafer-interface probes are adapted for testing an array of die during each touchdown. The prober according to an example any embodiment of the invention provides a wafer-mounting surface located in an X-Y reference plane and includes a wafer-interface probe adapted to simultaneously contact a non-rectangular array of die. Although each die may be generally rectangular, as is the probe contact pattern of the wafer-interface probe, the non-rectangular array of die can be chosen to approximate a sector of the circular wafer. Thus, there may be a quantization effect along the outer radius of the sector resulting from the rectangular shape of the individual die residing near the outer radius. A wafer platform and positioner is configured to rotate the wafer by a predetermined angle in parallel to the plane of the wafer-interface probe. Preferably, the predetermined angle corresponds to the angle subtended by the sector, such that a new sector is rotated into alignment with the non-rectangular contact pattern of the wafer-interface probe with each rotation of the wafer platform.

To ensure proper orientation of the wafer-interface probe contacts with the individual die of the array of die tested during a single touchdown, the orientation of die on the semiconductor wafer also varies according to sector. For example, using a 90 degree sector, the individual die within each quadrant of the circle all have the same orientation, but vary with respect to the orientation of die in an adjacent quadrant by 90 degrees. This ensures proper orientation of the array of die to the wafer-interface probe during touchdown and test.

Figure 1:
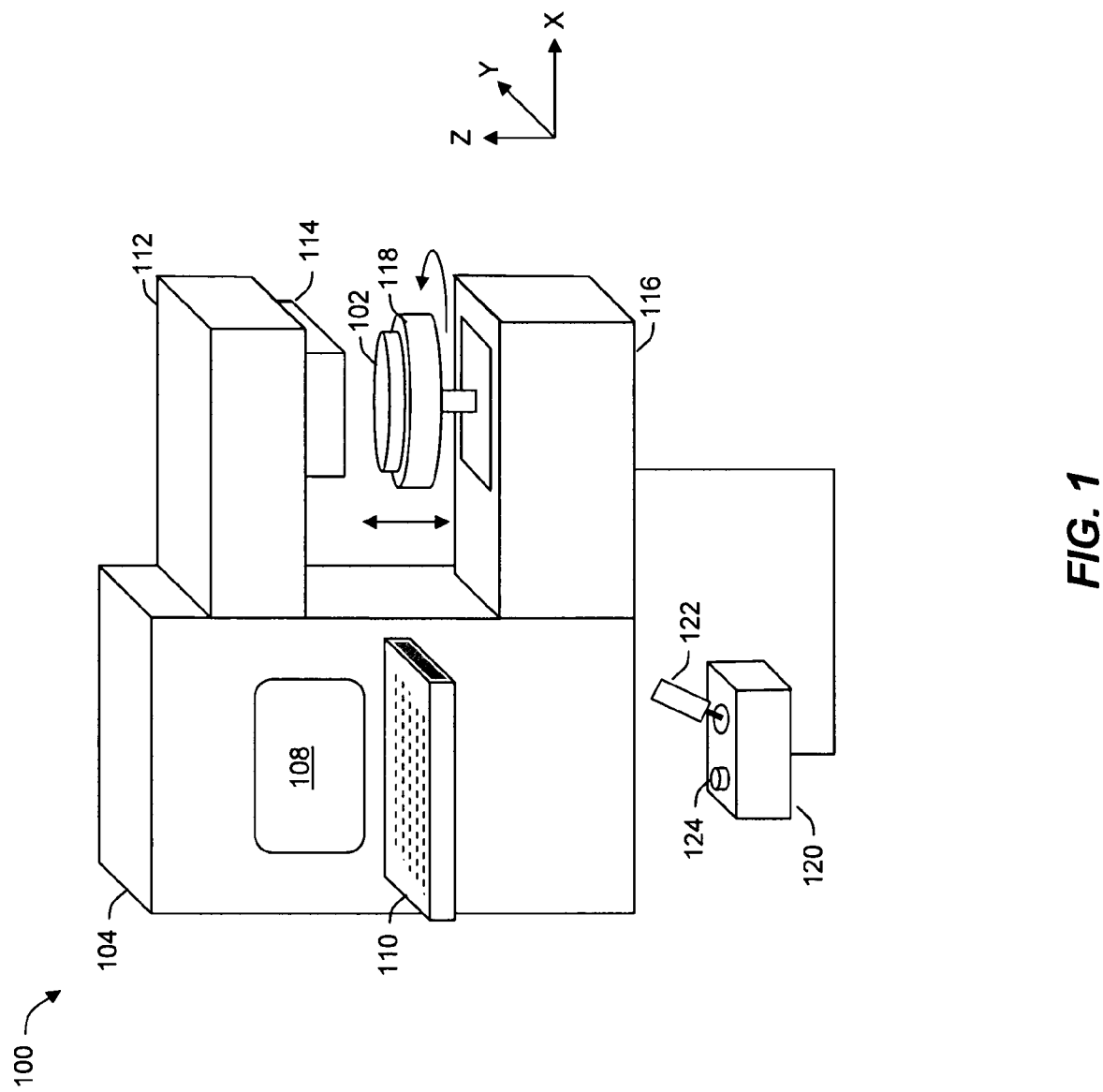
FIG. 1 is a perspective view of a semiconductor test system in accordance with the present invention.

An exemplary semiconductor test system 100 for performing electrical tests on a semiconductor wafer 102 is shown in FIG. 1. The semiconductor tester 100 generally includes a tester housing 104 within which electronics, such as a test controller, are provided for performing functional testing of one or more active circuits, or die on a semiconductor wafer 102. The electronics housed within the tester housing 104 are sometimes referred to as a tester mainframe. Preferably, the functional testing exercises substantially all of the functions of each die. In some embodiments, the semiconductor tester 100 includes a user interface, such as a display screen 108 and console 110 shown.

The semiconductor tester 100 also includes a test head 112 in communication with electronics housed within the tester housing 104, a probe interface assembly 114, and a prober 116, sometimes referred to as a handling apparatus. The prober 116 manipulates the wafer 102 with respect to the probe interface assembly 114. The probe interface assembly 114, in turn, provides an interface for sending and receiving signals to and from one or more of the wafer's die.

The prober 116 also includes a wafer-holding platform, or chuck 118. The chuck 118 provides a stable planar surface for supporting and positioning the wafer 102 in an X-Y plane parallel to the probe interface assembly 114. The chuck 118 is also configured to securely hold the wafer 102 during the course of testing.

Often, it is impractical to test all of the integrated circuits of a single wafer 102 at one time. To do so might over complicate the semiconductor tester 100, resulting in prohibitive costs or size. Thus, the probe interface assembly 114 is typically configured to test a subset of the number of integrated circuits, or die on a single wafer 102. The prober 116 is used to manipulate the chuck 118, bringing different regions of the wafer 102 into precise alignment with the probe interface assembly 114 for respective test cycles until all of the die have been tested. Manipulations can include movement within the X-Y plane and vertical translations in a perpendicular Z-direction to bring the wafer 102 into contact with the probe interface assembly 114. The X-Y planar movements can include rectilinear translations in one or more of the X and Y directions, rotations within the X-Y plane, and combinations thereof.

In some embodiments, a manual controller 120 can be used to control manipulations of the chuck 118 and wafer 102 secured thereon. For example, the manual controller 120 includes a joystick 122 allowing a user to adjust X-Y plane movements. The manual controller 120 may also include a vertical translation button 124 to control Z-directed translations. For example, a wafer 102 is placed on the chuck 118 and brought into a first alignment with the probe interface assembly 114 using the joystick 122. Once properly aligned, the vertical translation button 124 is manipulated to bring the wafer into electrical contact with the probe interface assembly 114. Electronics within the tester housing 104 generate test patterns that are communicated to the wafer 102 through the test head 112 and probe interface assembly 114. Monitored signals are communicated from the wafer 102 back to the electronics within the tester housing 104 along a similar path.

Once testing for the first alignment is completed, the vertical-translation button 124 is depressed again to disengage the wafer 102 from the probe interface assembly 114. The joystick 122 is manipulated to bring the wafer 102 into a second alignment with the probe interface assembly 114 and the process repeated until all of the die of the wafer 102 have been tested. Although a manual controller 120 is shown in this exemplary embodiment, it is more common for high volume semiconductor test systems 100 to include an automated wafer position controller. Such automated controllers can be included within the tester housing 104 and combined in a feedback loop with sensors, such as optical pattern recognition sensors to ensure proper alignment of the wafer 102 to the probe interface assembly 114. Such automated position control solutions are well known to those skilled in the art of high-volume semiconductor test.

Figure 2:
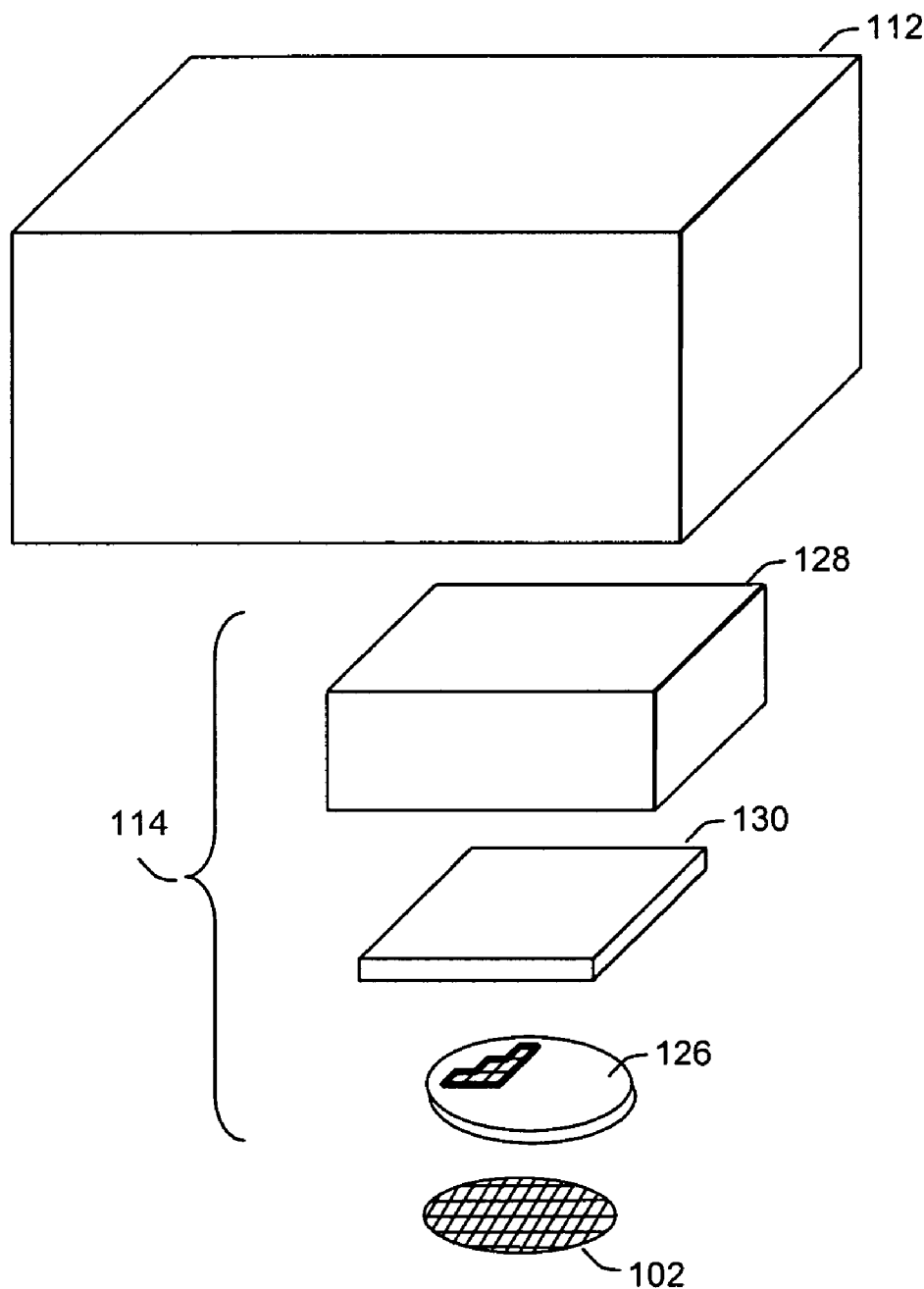
FIG. 2 is an exploded view of a test head/wafer interface assembly of the semiconductor test system of FIG. 1.

Referring to FIG. 2, an exploded perspective view of the test head 112 in combination with an exemplary embodiment of a probe interface assembly 114. The test head 112 houses tester channel cards that generate and receive test signals for application to and receipt from one or more of the integrated circuits or die provided on the wafer 102. The tester interface assembly 114 includes a wafer-interface probe 126 disposed proximate to the semiconductor wafer 102. The wafer-interface probe 126 typically includes a very dense array of microscopic contacts configured to contact a corresponding array of bonding pads on the semiconductor wafer 102. For embodiments intended to test multiple integrated circuits during a single touch down, the dense array of microscopic contacts is arranged into an array of multiple contact patterns. Each contact pattern is configured to contact a corresponding bonding pad pattern of a respective one of the integrated circuits or die. Together, the array of multiple contact patterns can be aligned with the bonding pad contacts of a corresponding array of integrated circuits.

An adapter board or assembly is typically provided to transition from this dense array of microscopic contacts of the wafer-interface probe to the channel cars of the test head 112. An exemplary embodiment includes a two-stage adapter assembly including a probe card 126 and a probe interface module 130. The probe card is positioned between the wafer-interface probe 126 and routes signals from a wafer side of the card to a test-head side. In some embodiments, signal routing further expands a footprint of contacts from wafer size to a larger size. The probe interface module 128 further routes signals from the probe card 126 to the channel cards of the test head 112.

Figure 3A:
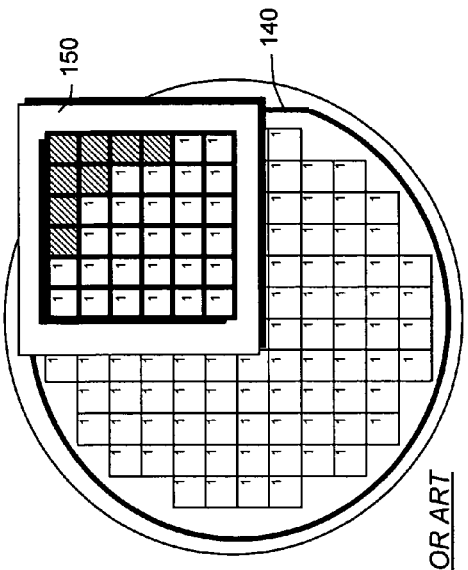
FIG. 3A is a plan view of a prior-art wafer probe interface positioned to test a first portion of a semiconductor wafer.

Referring to FIG. 3A, an exemplary semiconductor wafer 140 includes 114 devices or integrated circuits 142 arranged in a lattice. On each of the integrated circuits 142, there is a pattern of bonding pads (not shown in FIG. 3A) that allow external circuits to access functionality of the integrated circuit 142. The wafer 140 is sits on a wafer-holding platform, or chuck 144, as shown. The chuck 144 includes securing means, such as a vacuum, for securely holding the wafer 140 in a stationary relationship with respect to the chuck 144 during testing. Shown in position above the wafer is an exemplary prior-art wafer-interface probe 146.

The wafer-interface probe 146 includes dense array of microscopic contacts 148 configured to establish electrical communication with the pattern of bonding pads of the one or more integrated circuits 142. Preferably, the wafer-interface probe 146 includes an array of multiple contact patterns 150 configured to register with patterns of bonding pads of a corresponding array of integrated circuits 142 of the same wafer 140. This allows for multiple integrated circuits 142 to be tested in parallel, leading to a reduction in the wafer test throughput time.

In the exemplary embodiment, the wafer-interconnect probe 146 includes a 36-element array 150 of contact patterns arranged in a rectangular array of six rows by six columns. The 36-element array of contact patterns 150 is positioned to electrically interconnect with the bonding pads of up to 36 integrated circuits 142 at the same time, during a single touch down. The 36-element array 150 can be aligned with one quadrant of the wafer 140, as shown. As each quadrant of the exemplary wafer 142 includes 28 integrated circuits 142, or die, eight elements of the 36-element array of contact patterns 150 will not touch down on die 142. This results in an inefficiency as one quarter of the available test resources go unused during a test cycle for the touch down. Unwed test resources can result in a costly reduction to test throughput efficiency.

Figure 3B:
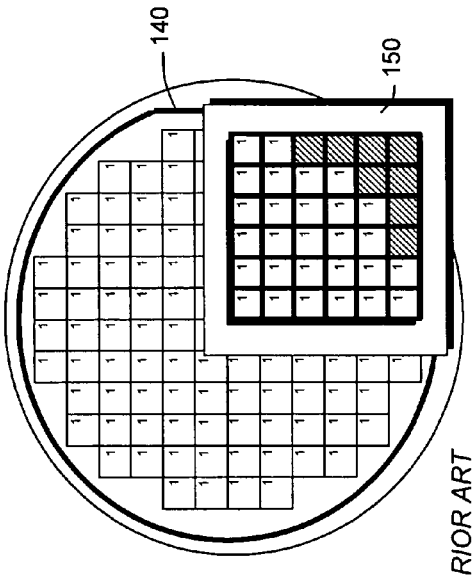
FIG. 3B through FIG. 3D are plan views of the prior-art wafer-interface probe positioned to test different respective portions of the semiconductor wafer.
Figure 3C:
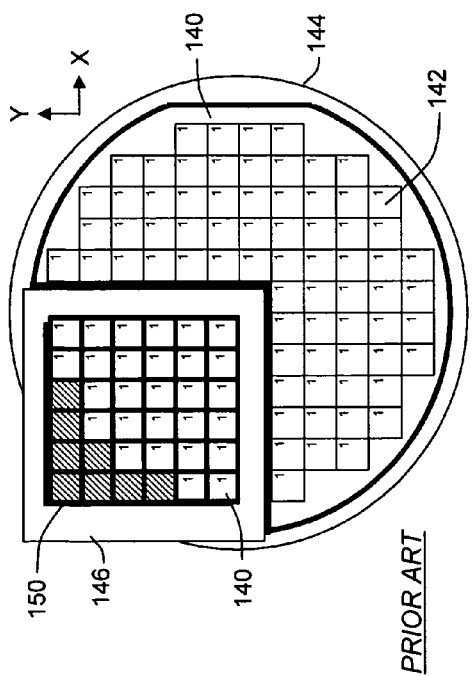
Figure 3D:
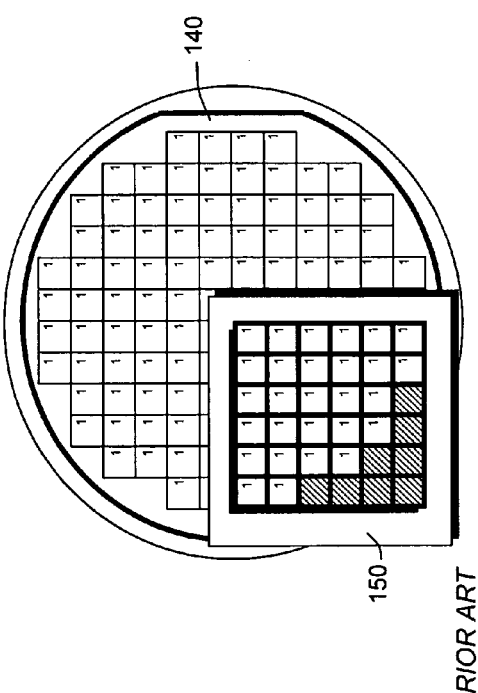

When the test cycle for the first position is completed, a prior-art prober moves the chuck 144 to a new position, bringing a new array of die 142 into alignment with the 36-element array of contact patterns 150 of the wafer-interface probe 146. The configuration shown in FIG. 3B represents movement of the wafer 140 negative six die widths along the X-direction, such that the wafer-interface probe 146 aligns with a different quadrant of the wafer 140. Once again, eight elements of the available 36-element array of contact patterns 150 remain unused. FIG. 3C reflects movement of the wafer 140 positive six die widths along the Y-direction to test yet another quadrant of the wafer 140 with a similar inefficiency. Finally, FIG. 3D reflects movement of the wafer 140 positive six die widths along the X-direction to test a final quadrant of the wafer 140 with the inefficiency.

The size and configuration of the wafer 140, the integrated circuits 142, and the array of multiple contact patterns 150 is exemplary for illustrative purposes. Prior art wafer-interface probes are available to test up to 32, 64, 128, 256, or even higher numbers of integrated circuits simultaneously, depending upon the type of device being tested. The circular layout of the wafer 140 combined with the rectangular lattice or tiling pattern of the integrated circuits 142, however, ensures some level of inefficiency left as a tradeoff to the test designer between number of touchdowns per wafer and number of unused test channels per touchdown.

Figure 4B:
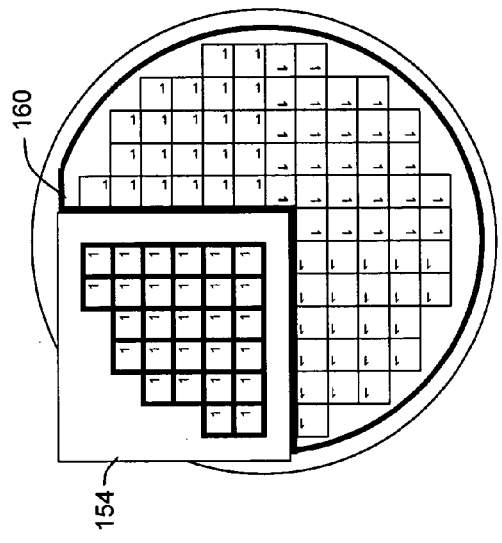
Figure 4C:
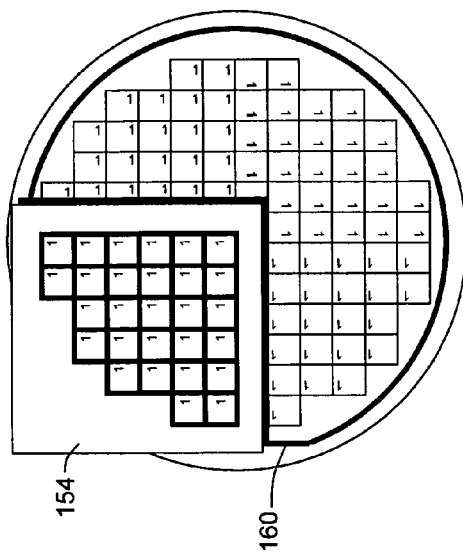
Figure 4A:
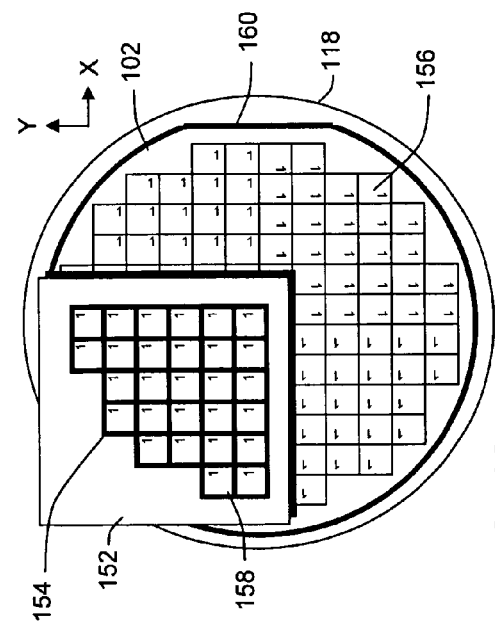
FIG. 4A is a plan view of one embodiment of a wafer-interface probe according to the present invention positioned to test a first portion of a semiconductor wafer.

Referring to FIG. 4A, one embodiment of a sectorized wafer-interface probe 152 includes a non-rectangular, two-dimensional array of contact patterns 154. Once again, an exemplary wafer 102 positioned on a chuck 118 includes 116 integrated circuits, or die 156. The array of contact patterns 154 of the sectorized probe 152 are arranged to align with a corresponding number of die 156 in a common sector of the wafer 102. In this exemplary embodiment, the sector is a 90-degree, wedge-shaped sector. The array of contact patterns 154 includes 28 elements 158 configured to establish electrical communication with the pattern of bonding pads of all 28 die 156 in a first quadrant of the wafer 102. Although the invention is not so limited, the illustrative embodiment provides that each of the elements 158 of the array of contact patterns 154 touches down on a respective die 156, with no elements 158 being left unused during a test cycle run during the single touchdown.

Typically, a wafer 102 includes one or more distinguishing marks along its circumference, such as the flat portion 160 shown. When testing of the die 156 of the first position is completed, a rotary prober 116 moves the chuck 118 to a new position, bringing a new array of die 156 into alignment with the 28-element array of contact patterns 154 of the wafer-interface probe 152. The configuration shown in FIG. 4B represents movement of the wafer 102 by 90 degrees in a counter-clockwise direction, such that the wafer-interface probe 152 aligns with a different quadrant of the wafer 102. Once again, each element 158 of the available 28-element array of contact patterns 154 contacts a respective die 156 with no elements 158 being left unused. Although no elements left unused during a single touchdown represents 100% utilization of available test resources, improvements can still be realized for embodiments in which one or more of the elements 158 is left unused. For applications in which the orientation of microscopic contacts of each element 158 is relevant, it is worth noting that a corresponding orientation of the bonding pad patterns of each die 156 of the second quadrant is oriented on the wafer 102 to preferentially align with the element 158 when rotated into the position shown.

Figure 4D:
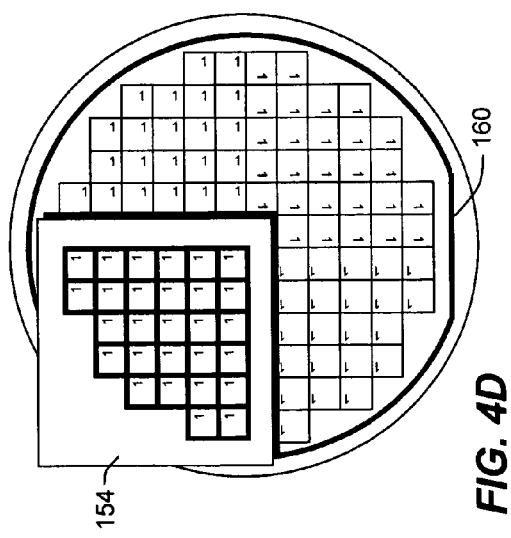

FIG. 4C reflects another rotary movement of the wafer 140 by 90 degrees in the counter-clockwise direction to test yet another quadrant of the wafer 102 with a similar 100% efficiency. Finally, FIG. 4D reflects yet another rotary movement of the wafer 102 by a final 90 degrees in the counter-clockwise direction to test a final quadrant of the wafer 102, resulting once again in a 100% efficiency. As described above for the second rotation of FIG. 3B, the die 156 in each of the final two quadrants tested are fashioned on the wafer 102 with a preferred orientation to properly align with the dense array of microscopic contacts of each of the elements 158 of the array of contact patterns 154.

Figure 5A:
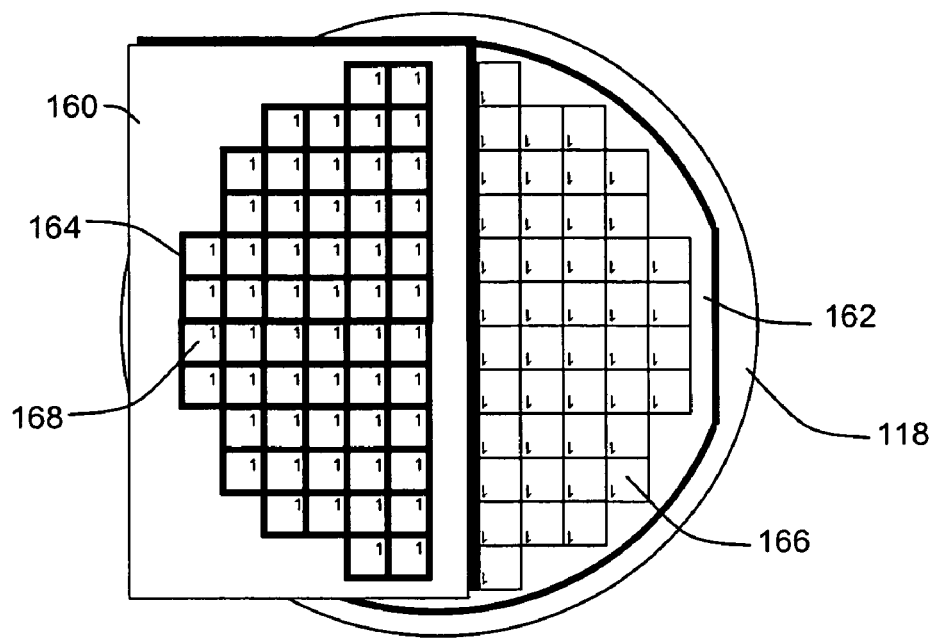
FIGS. 5A and 5B are plan views of an alternative embodiment of a wafer-interface probe according to the present invention positioned to test different respective portions of a semiconductor wafer.

Referring to FIG. 5A, an alternative embodiment of a sectorized wafer-interface probe 160 includes a non-rectangular, two-dimensional array of contact patterns 164. Once again, an exemplary wafer 162 positioned on a chuck 118 includes 116 integrated circuits, or die 166. The array of contact patterns 164 of the sectorized probe 160 are arranged to align with a corresponding number of die 166 in a common sector of the wafer 162. In this exemplary embodiment, the sector is a 180-degree, semicircular sector. The array of contact patterns 164 includes 56 elements 168 configured to establish electrical communication with the pattern of bonding pads of all 56 die 166 in a first semicircular sector of the wafer 162. Beneficially, each of the elements 168 of the array of contact patterns 164 touches down on corresponding die 166, with no elements 168 being left unused during a single touchdown. In some embodiments one or more of the elements 168 can be left unused during one or more touchdowns on a single wafer.

Figure 5B:
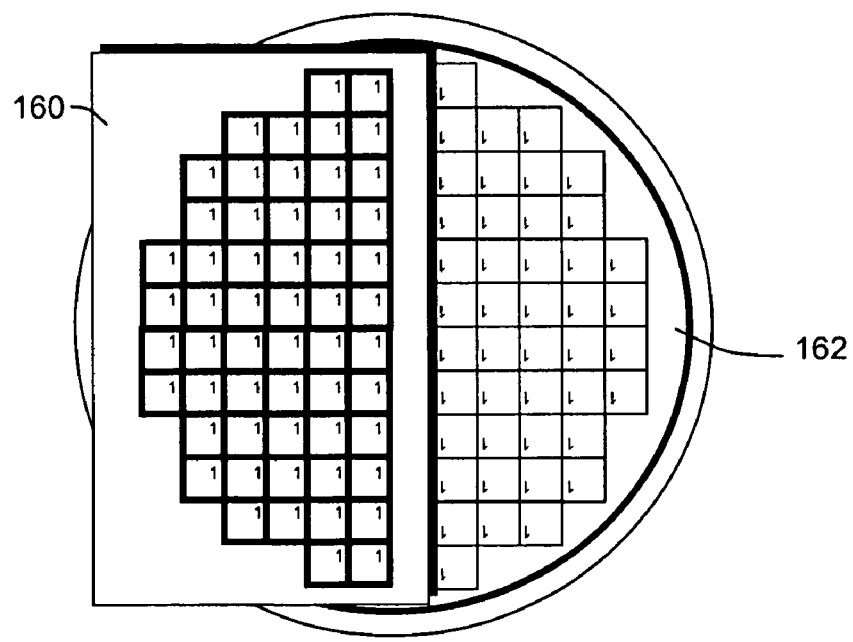

When testing of the die 166 of the first position is completed, a rotary prober 116 moves the chuck 118 to a new position, bringing a new array of die 166 into alignment with the 56-element array of contact patterns 164 of the wafer-interface probe 160. The configuration shown in FIG. 5B represents movement of the wafer 162 by 180 degrees in either a clockwise, or counter-clockwise direction, such that the wafer-interface probe 162 aligns with a different semicircular sector of the wafer 162. Once again, each element of the available 56-element array of contact patterns 164 contacts a respective die 166 with no elements 168 being left unused. For applications in which the orientation of microscopic contacts of each element 168 is relevant, it is again worth noting that a corresponding orientation of the bonding pad patterns of each die 166 of the second semicircular sector is oriented on the wafer 162 to preferentially align with the element 168 when the wafer is rotated into the position shown.

Figure 6B:
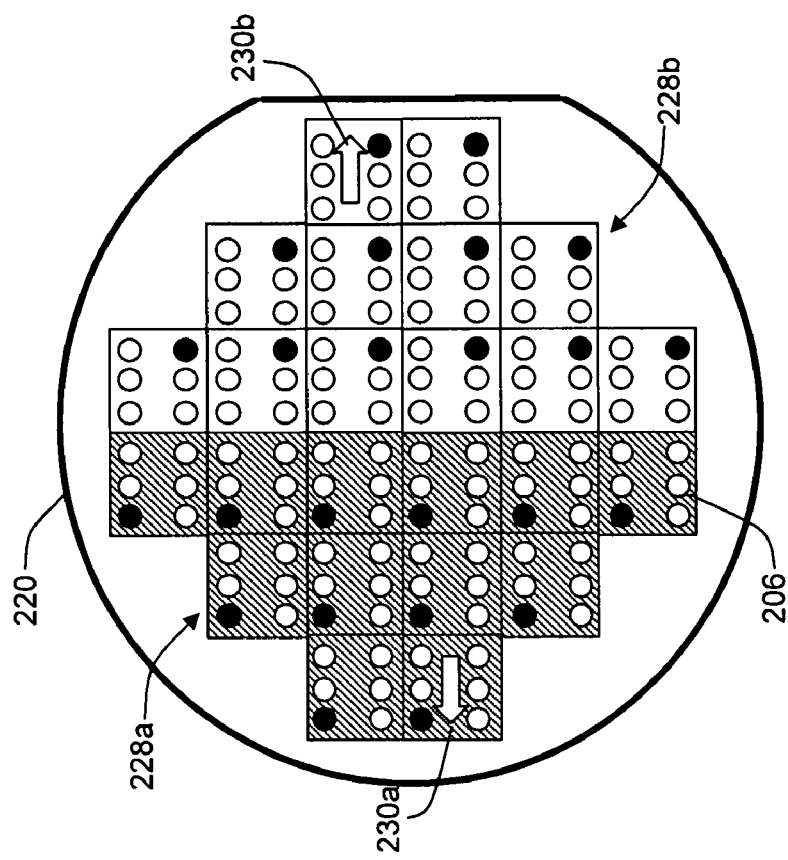
FIG. 6B is a plan view of an alternative embodiment of a semiconductor wafer adapted for rotary repositioning according to the present invention.
Figure 6A:
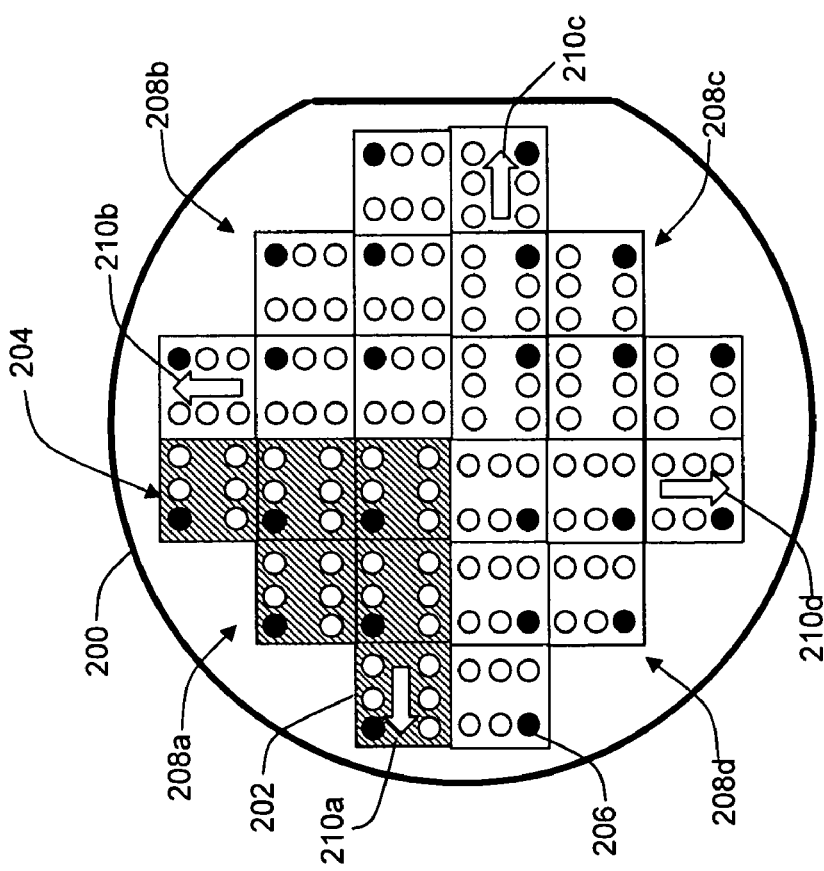
FIG. 6A is a plan view of one embodiment of a semiconductor wafer adapted for rotary repositioning according to the present invention.

An exemplary wafer 200 configured for rotational positioning is shown in FIG. 6A. The wafer 200 includes a number of integrated circuits or die 202 configured in a lattice on a surface of the wafer 200. Each of the die 202 include a respective pattern of bonding pads 204 having an orientation identified by an identifiable one of the bonding pads, such as a first identified pad 206 (i.e., pad number 1) of the pattern of bonding pads 204.

Each of the die 202 of a common sector is configured to have the same rotational orientation as all of the other die 202 of the same sector. In the exemplary embodiment, all of the die 202 within a first 90-degree sector 208a have a common orientation in that all of the first identified pads 206 are in the upper left hand corner of their respective die 202. The first orientation is further illustrated by the arrow 210a pointing in a direction of 180 degrees with respect to a reference coordinate system. Similarly, all of the die 202 within a second 90-degree sector 208b have a common orientation that is 90 degrees shifted from the first quadrant 208a. The orientation of the second quadrant is further illustrated by the arrow 210b pointing in a direction of 90 degrees with respect to the same reference coordinate system. The remaining third and fourth quadrants 208c, 208d are similarly configured having respective common orientations of 180 degrees and 270 degrees as illustrated by their respective arrows 210c, 210d.

The die 202 of the first quadrant 208a are shown shaded to represent those die 202 contacted by a 90-degree sectorized wafer-interface probe 152. When the wafer 200 is rotated 90 degrees after completion of testing the first sector 208a, it is apparent that die 202 of the second sector 208b will have the same general orientation as the first sector previously had with respect to the stationary probe 152. Namely, the reference arrow 210b of the second sector 208b will be oriented at 180 degrees, representative of the original 90-degree orientation offset by the 90-degree rotation of the wafer. Thus, a stationary wafer-interface probe will be correctly aligned with the second sector 208b after rotation. Similar alignments are realized with each of the third and fourth quadrants 208c, 208d as they are ultimately rotated into alignment after respective second and third rotations.

Referring to FIG. 6B, an alternative embodiment of a wafer 220 configured with semicircular sectors 228a, 228b, adapted for 180-degree rotations. Each of the sectors 228a, 228b has a common orientation that is 180 degrees shifted from the first sector 228a. The orientation of the first sector is illustrated by an arrow 230a pointing in a reference angle of 180 degrees. The orientation of the second sector is illustrated by another arrow 230b pointing in a reference angle of 0 degrees.

The die 222 of the first sector 228a are shown shaded to represent those die 222 contacted by a 180-degree sectorized wafer-interface probe (not shown in FIG. 6B). When the wafer 220 is rotated 180 degrees after completion of testing the first sector 228a, it is apparent that die 222 of the second sector 228b will have the same general orientation as the first sector previously had. Namely, the reference arrow 230b of the second sector 228b will be oriented at 180 degrees, representative of the original 180-degree orientation offset by the 180-degree rotation of the wafer. Thus, a stationary wafer-interface probe will be correctly aligned with the second sector 228b after rotation.

Figure 7:
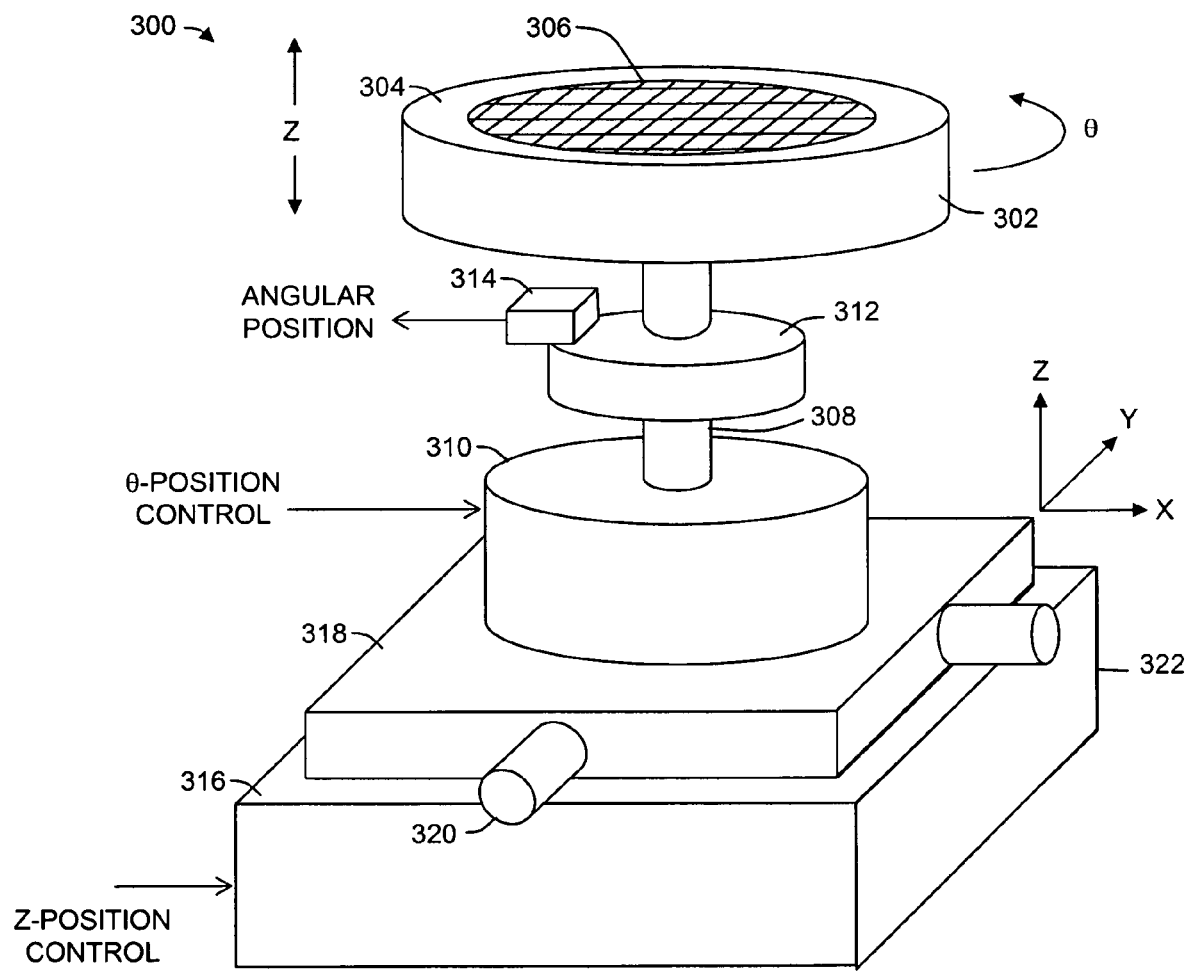
FIG. 7 is a perspective diagram of an exemplary embodiment of a rotary wafer prober according to the present invention.

Referring to FIG. 7, a perspective view of an exemplary rotary prober 300 is shown. The prober includes a wafer-holding platform, or chuck 302 including a planar surface 304 for holding a semiconductor wafer 306 thereon. The chuck 302 is coupled to one end of a spindle or shaft 308. The shaft is in communication with a rotary motor 310. The shaft 308 may be directly coupled to the rotary motor 310 or coupled through a mechanical linkage, such as a chain or gear train. Activation of the rotary motor 310 causes the shaft 308 to rotate, which, in turn, rotates the chuck 302.

In some embodiments, an angle encoder 312 is included to provide a measure of the angular position and/or displacement of the shaft 308 with respect to a reference position (e.g., 0 degrees, or 12 o'clock). When combined with an angular position sensor 314, a signal indicative of the angular position can be provided to a controller to control an angular position of the chuck 302. The controller and sensor can be configured in a feedback loop to provide automatic operation of the rotary chuck 302.

A Z-position controller 316 is provided to selectively translate the flat surface 304 of the chuck 302 in a vertical direction, perpendicular to an X-Y plane of the wafer 306. Thus, the Z-position controller 316 can be used to urge the wafer 306 and wafer-interface probe into electrical contact in preparation for a test cycle. Similarly, the Z-position controller 316 can be used to disengage the wafer 306 and wafer-interface probe to allow for rotation of the chuck 302 between test cycles. As shown, the rotary motor 310 and chuck 302 can be positioned on top of the Z-position control.

In some embodiments, the rotary probe 300 also includes a rectilinear translation stage. For example, a fine tune X-Y translation stage 318 is positioned between the rotary motor 310 and the Z-position controller 316. The X-Y translation stage 318 can be used to independently adjust the chuck 302 within the X-Y plane, without inducing any rotation. Tuning can be accomplished by independently adjusting one or more of an X-position adjuster 320 and a Y-position adjuster 322. Adjustments can be performed manually as with a micrometer, or automatically using micro-positioning motors or motor driven micrometers. In some embodiments, optical techniques can be used and combined with automatic positioners in a servo-control configuration.

The adjustments are particularly useful for an initial fine tune adjustment of the wafer 306 to align the first sector. Once aligned, rotation without translation in the X-Y plane is preferably sufficient for testing the remaining sectors of the wafer.

Figure 8:
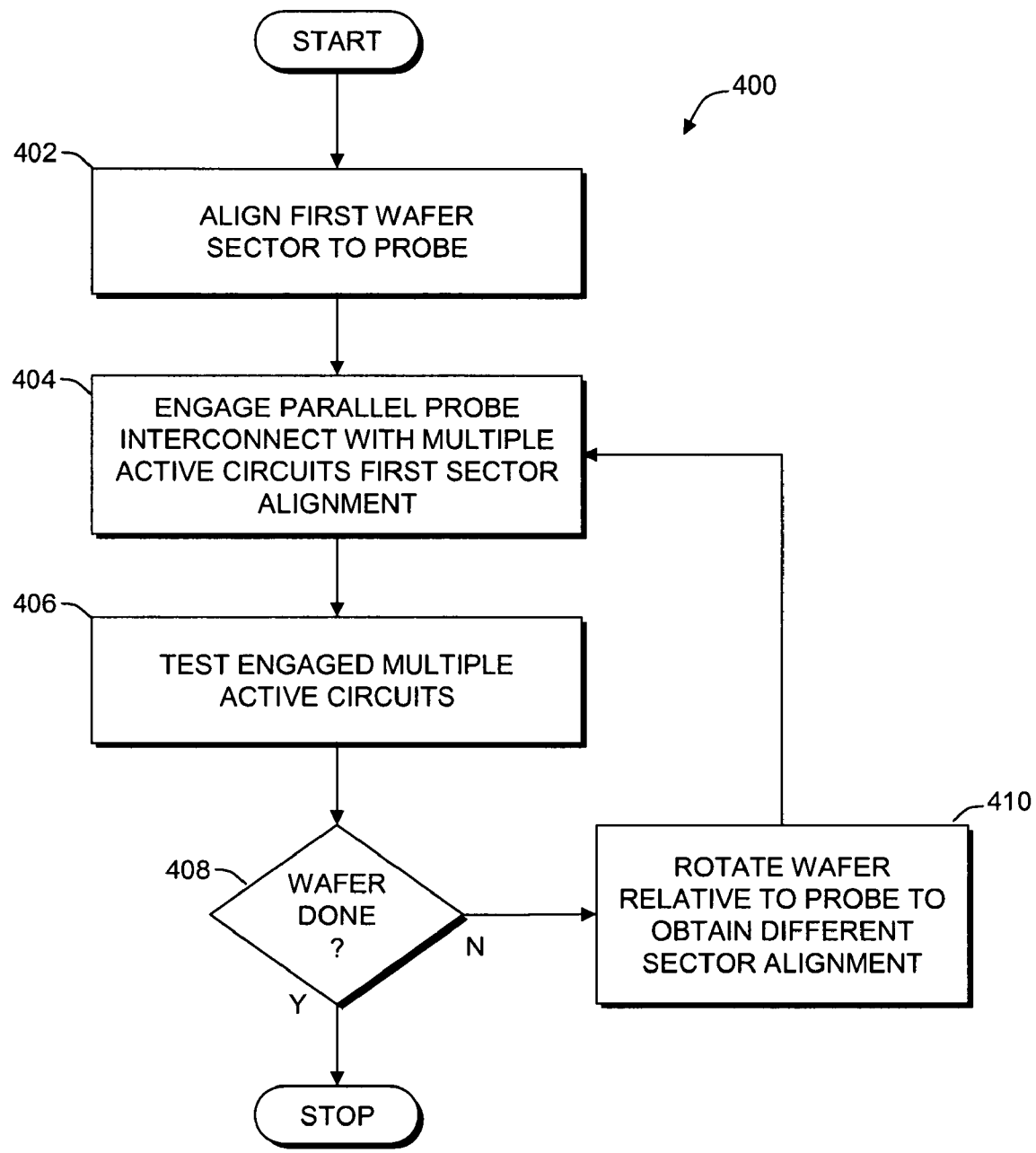
FIG. 8 is a flow diagram of an exemplary method for testing a semiconductor wafer according the present invention.

A flow diagram of an exemplary process for testing a semiconductor wafer according to the present invention is illustrated in FIG. 8. Initially, a wafer 102 (FIG. 1) is placed on the chuck 118. At Step 402, the wafer 102 is aligned to the wafer-interface probe 126 (FIG. 2). This step can include manipulation of an X-Y translation stage 318 (FIG. 7) when available. At Step 404, the bonding pads of multiple die within a first sector of a wafer 102 are brought into electrical communication with an array of contact patterns on the wafer-interface probe. At Step 406, the semiconductor tester 100 (FIG. 1) functionally tests the integrated circuits of each of the die coupled to the semiconductor tester through the wafer-interface probe. At Step 408, if testing of all of the die of the wafer under test is not completed, the wafer is disengaged from the wafer-interface probe and rotated relative to the probe to bring a different sector into alignment with the wafer-interface probe (Step 410). It is understood that the wafer-interface probe may be rotated and/or the wafer under test may be rotated. Step 404 through Step 410 are repeated until at Step 408 all sectors of the wafer under test have been tested.

While this invention has been particularly shown and described with references to preferred embodiments thereof, it will be understood by those skilled in the art that various changes in form and details may be made therein without departing from the scope of the invention encompassed by the appended claims.

What is claimed is:

1. A semiconductor tester adapted for testing a semiconductor wafer including a plurality of integrated circuits arranged in a lattice, the semiconductor tester comprising:
   a wafer-interface probe having at least three contact patterns arranged in a non-rectangular, two-dimensional array, each contact pattern adapted to interface with a corresponding bonding pad pattern of a respective one of a plurality of integrated circuits disposed in a lattice on the semiconductor wafer, the two-dimensional array of contact patterns covering at least a 90 degree sector and no more than a 180 degree sector of the semiconductor wafer; and
   a rotary wafer handler rotating the semiconductor wafer relative to the wafer-interface probe between tests, bringing each of the at least three contact patterns into simultaneous alignment with a bonding pad pattern of a respective one of a plurality of integrated circuits, each of the at least three contact patterns providing electrical interconnection with a respective one of the aligned bonding pad patterns.

2. The tester of claim 1, wherein the rotary wafer handler rotates the semiconductor wafer about 90 degrees between tests, the plurality of integrated circuits aligned with the at least three respective contact patterns of the wafer-interface probe approximating one quadrant of the semiconductor wafer.

3. The tester of claim 1, wherein the rotary wafer handler rotates the semiconductor wafer about 180 degrees between tests, the plurality of integrated circuits aligned with the at least three respective contact patterns of the wafer-interface probe approximating one half of the semiconductor wafer.

4. The tester of claim 1, wherein the rotary wafer handler rotates the semiconductor wafer by a predetermined angle between tests, the plurality of integrated circuits aligned with the at least three respective contact patterns of the wafer-interface probe approximating a contiguous sector of the semiconductor wafer.

5. The tester of claim 4, wherein the lattice of integrated circuits disposed on the semiconductor wafer is non-rectangular.

6. The tester of claim 5, wherein the at least three contact patterns of the wafer-interface probe are arranged in a wedge-shaped configuration.

7. The tester of claim 1, wherein the at least three contact patterns of the wafer-interface probe are arranged in a non-rectangular configuration.

8. The tester of claim 1, wherein the rotary wafer handler comprises a vertical displacement stage urging the semiconductor wafer toward the wafer-interface probe ensuring that each of the at least three contact patterns touches an aligned bonding pad pattern of a respective one of a plurality of integrated circuits prior to test.

9. A wafer-interface probe comprising a plurality of contact patterns arranged in a non-rectangular, two-dimensional array, each contact pattern adapted to interface with a corresponding bonding pad pattern of a respective one of a plurality of integrated circuits of a semiconductor wafer, wherein the non-rectangular, two-dimensional array comprises a wedge shape, the two-dimensional array of contact patterns covering at least a 90 degree sector and no more than a 180 degree sector of the semiconductor wafer.

* * * * *